(12) United States Patent
Chen et al.

(10) Patent No.: US 12,326,471 B2
(45) Date of Patent: Jun. 10, 2025

(54) TRANSFORMER BUSHING PARTIAL DISCHARGE MONITORING CHIP DEVICE AND METHOD

(71) Applicant: STATE GRID ZHEJIANG ELECTRIC POWER COMPANY LIMITED ELECTRIC POWER RESEARCH INSTITUTE, Hangzhou (CN)

(72) Inventors: Xiaoxin Chen, Hangzhou (CN); Xianjun Shao, Hangzhou (CN); Ping Qian, Hangzhou (CN); Chen Li, Hangzhou (CN); Yiming Zheng, Hangzhou (CN); Jiangyang Zhan, Hangzhou (CN); Wenlin He, Hangzhou (CN); Haibao Mu, Hangzhou (CN); Huibin Tao, Hangzhou (CN); Xiang Sun, Hangzhou (CN); Haojun Liu, Hangzhou (CN)

(73) Assignee: STATE GRID ZHEJIANG ELECTRIC POWER COMPANY LIMITED ELECTRIC POWER RESEARCH INSTITUTE, Hangzhou (CN)

( * ) Notice: Subject to any disclaimer, the term of this patent is extended or adjusted under 35 U.S.C. 154(b) by 0 days.

(21) Appl. No.: 18/283,843

(22) PCT Filed: May 15, 2023

(86) PCT No.: PCT/CN2023/094261
§ 371 (c)(1),
(2) Date: Sep. 25, 2023

(87) PCT Pub. No.: WO2023/174448
PCT Pub. Date: Sep. 21, 2023

(65) Prior Publication Data
US 2024/0168077 A1    May 23, 2024

(51) Int. Cl.
*H01H 31/12* (2006.01)
*G01R 31/12* (2020.01)
(Continued)

(52) U.S. Cl.
CPC ......... *G01R 31/1263* (2013.01); *G01R 31/14* (2013.01); *G01R 31/16* (2013.01)

(58) Field of Classification Search
CPC ........ G01R 31/14; G01R 31/16; G01R 31/62; G01R 31/1245; G01R 31/1263; G01R 31/1272
See application file for complete search history.

(56) References Cited

U.S. PATENT DOCUMENTS

| 6,345,236 | B1 * | 2/2002 | Bertheau | G01R 31/12 |
| | | | | 702/107 |
| 11,328,862 | B1 * | 5/2022 | Hutson | H01F 27/02 |

(Continued)

FOREIGN PATENT DOCUMENTS

| CN | 202256590 U | 5/2012 |
| CN | 107301982 A | 10/2017 |

(Continued)

OTHER PUBLICATIONS

Xian-Jun Shao, et al., An Integrated Sensor with SiP Chip for Bushing Partial Discharge Monitoring of UHV Transformer, 2022 IEEE Conference on Electrical Insulation and Dielectric Phenomena, 2022, pp. 187-191.

*Primary Examiner* — Thang X Le
(74) *Attorney, Agent, or Firm* — Bayramoglu Law Offices LLC (57) ABSTRACT

A transformer bushing partial discharge monitoring chip device and method are provided. An acquisition unit comprises three sensor modules installed at end screens of three-phase bushings of a transformer respectively for (Continued)

acquiring partial discharge signals and power frequency current signals from the transformer bushing end screens; each of the sensor modules is connected to an SIP digitization unit through a wire; the SIP digitization unit is fixedly installed beneath a base of the acquisition unit for digitizing the partial discharge signals and the power frequency current signals; an output end of the SIP digitization unit is connected to an input end of a background processing terminal.

4 Claims, 6 Drawing Sheets

(51) Int. Cl.
*G01R 31/14* (2006.01)
*G01R 31/16* (2006.01)

(56) References Cited

U.S. PATENT DOCUMENTS

| | | | | |
|---|---|---|---|---|
| 2012/0092114 | A1* | 4/2012 | Matthews | H01F 27/402 336/107 |
| 2013/0128396 | A1* | 5/2013 | Danesh | G01R 23/02 361/45 |
| 2020/0366079 | A1* | 11/2020 | Telefus | H01H 71/24 |
| 2021/0215772 | A1* | 7/2021 | Mauney | G01R 19/16566 |
| 2023/0077781 | A1* | 3/2023 | Hutson | H02J 50/001 324/547 |

FOREIGN PATENT DOCUMENTS

| | | |
|---|---|---|
| CN | 109860137 A | 6/2019 |
| CN | 110176439 A | 8/2019 |
| CN | 111505701 A | 8/2020 |
| CN | 215180796 U | 12/2021 |
| CN | 113985223 * | 1/2022 |
| CN | 113985223 A | 1/2022 |
| CN | 215496704 U | 1/2022 |
| CN | 114594351 A | 6/2022 |
| JP | 2004101418 A | 4/2004 |
| KR | 101103677 B1 | 1/2012 |
| KR | 20150108147 A | 9/2015 |
| KR | 20160091084 A | 8/2016 |

* cited by examiner

TRANSFORMER BUSHING PARTIAL DISCHARGE MONITORING CHIP DEVICE AND METHOD

CROSS REFERENCE TO THE RELATED APPLICATIONS

This application is the national phase entry of International Application No. PCT/CN2023/094261, filed on May 15, 2023, which is based upon and claims priority to Chinese Patent Application No. 202210268797.8, filed on Mar. 18, 2022, the entire contents of which are incorporated herein by reference.

TECHNICAL FIELD

The present invention relates to the technical field of transformers, and in particular to a transformer bushing partial discharge monitoring chip device and method.

BACKGROUND

Large oil-immersed power transformers are the key and core equipment of the power grid and are numerous in quantity. Their health condition directly affects the safe and stable operation of the power grid. With the increase of voltage classes, the proportion of transformer faults caused by bushings gradually increases. A significant amount of research has been conducted domestically and internationally on the causes of bushing accidents, detection techniques, and diagnostic analysis techniques. It has been found that the main causes of bushing accidents are closely related to moisture, overheating, and partial discharges in oil-paper insulation. In order to proactively detect equipment faults, bushing monitoring has become an essential technical means.

Common types of faults that occur in transformer bushings during operation include bushing moisture and partial discharge. Therefore, it is necessary to install sensors for partial discharge and leakage current at the bushing end screen to monitor the operational status of the bushing. Due to the high-performance acquisition and processing unit typically required for acquiring signals like partial discharge, the size and complexity of the board device are increased. The board device is usually installed in the nearby control cabinet of the transformer, connected to the bushing end screen sensor through a coaxial cable ranging from 10 to 20 meters. Despite cable shielding measures, weak signals are still susceptible to on-site electromagnetic interference, significantly reducing the precision of transformer bushing signal testing. As a result, it directly affects the accuracy of transformer bushing fault monitoring.

SUMMARY

The present invention provides a transformer bushing partial discharge monitoring chip device and method for solving the following technical problems: Existing transformer bushing partial discharge monitoring devices are of large sizes, have long wiring and a long transmission distance for acquired signals, and are susceptible to electromagnetic interference during transmission, resulting in low accuracy of transformer bushing monitoring.

In one aspect, the present invention provides a transformer bushing partial discharge monitoring chip device, comprising an acquisition unit, a system in package (SIP) digitization unit, and a background processing terminal, wherein the SIP digitization unit comprises a wireless communication unit and an SIP chip;

the acquisition unit comprises a plurality of sensor modules installed at end screens of three-phase bushings of a transformer respectively for acquiring partial discharge signals and power frequency current signals from the transformer bushing end screens;

each of the sensor modules in the acquisition unit is connected to the SIP digitization unit through a wire to transmit the acquired partial discharge signals and power frequency current signals to the SIP digitization unit for digitization;

the SIP digitization unit is installed inside the transformer, and a length of the wire is determined according to a distance between the acquisition unit and the SIP digitization unit;

the SIP digitization unit is fixedly installed beneath a base of the acquisition unit for digitizing the partial discharge signals and the power frequency current signals, so as to obtain partial discharge information of the transformer bushings;

an output end of the SIP digitization unit is connected to an input end of the background processing terminal for transmitting the partial discharge information to the background processing terminal through the wireless communication unit for processing, so as to enable the background processing terminal to determine the presence of partial discharge in the transformer bushings based on the partial discharge information.

The present invention achieves simultaneous acquisition of the partial discharge signals and the power frequency current signals from the three-phase bushings of the transformer by installing the sensor modules at the end screens of the three-phase bushings of the transformer, respectively. By integrating the acquisition unit and the digitization unit, and using only short wires for connection, the transmission distance of the acquired signals is greatly reduced, and electromagnetic interference on the signals is hence reduced, thereby improving the precision of signal logic calculation and improving the accuracy of transformer bushing partial discharge monitoring.

Furthermore, each of the sensor modules comprises a high frequency current sensor and a power frequency current sensor; the high frequency current sensor is used to acquire the partial discharge signals from the transformer bushing end screens; the power frequency current sensor is used to acquire the power frequency current signals from the transformer bushing end screens; the high frequency current sensor and the power frequency current sensor are attached to a same grounding rod.

The power frequency current sensor and the high frequency current sensor are packaged in a single sensor module according to the present invention, enabling coupled measurements. As a result, the sensor modules according to the present invention can simultaneously acquire the partial discharge signals and the power frequency current signals from the transformer bushing end screens.

Furthermore, the sensor modules are tightly crimped with leads of the transformer bushing end screens via contact fingers; the contact fingers are connected to the grounding rod for grounding the sensor modules; bottoms of the sensor modules are supported by bases; the SIP digitization unit is fixedly installed beneath the bases of the sensor modules; the high frequency current sensor and the power frequency current sensor are connected respectively to the SIP digitization unit, so as to transmit the acquired partial discharge signals and power frequency current signals to the SIP digitization unit for digitization, obtaining the partial discharge information of the transformer.

Even further, the SIP chip comprises one high-speed acquisition channel and four low-speed acquisition channels; an input end of the high-speed acquisition channel is connected to the high frequency current sensor; the high-speed acquisition channel comprises an instrumentation amplifier and a 125 MHz high-speed analog-to-digital (A/D) converter; the instrumentation amplifier is used to amplify the partial discharge signals, and the 125 MHz high-speed A/D converter is used to convert the partial discharge signals into partial discharge digital signals for subsequent logic calculations of the partial discharge digital signals, the low-speed acquisition channels comprise instrumentation amplifiers and 2 MHz low-speed A/D converters; an input end of one of the low-speed acquisition channels is connected to the power frequency current sensor; the instrumentation amplifier is used to amplify the power frequency current signals, and the 125 MHz high-speed A/D converter is used to convert the power frequency current signals into power frequency current digital signals for subsequent logic calculations of the power frequency current digital signals; input ends of the other three low-speed acquisition channels are reserved interfaces for connecting other signal acquisition devices.

The present invention achieves high-performance acquisition capability of the SIP chip by designing one high-speed acquisition channel and four low-speed acquisition channels. Additionally, the reserved expansion interfaces facilitate future expansion of SIP chip applications.

Even further, the SIP chip further comprises a field programmable gate array (FPGA) programmable logic device; the FPGA programmable logic device contains pre-configured arithmetic logic; input ends of the FPGA programmable logic device are connected to the high-speed acquisition channel and the low-speed acquisition channels, so as to receive the partial discharge digital signals and the power frequency current digital signals; and the partial discharge digital signals and the power frequency current digital signals are subjected to logic calculations based on the pre-configured arithmetic logic, obtaining the partial discharge information of the transformer; and the partial discharge information is transmitted to the background processing terminal through a wireless communication interface or an Ethernet interface.

The present invention employs an FPGA chip with strong computing power to meet the high-performance computational requirements of the SIP chip as required by the present invention.

Even further, the SIP chip further comprises a temperature and humidity microsensor and a vibration microsensor; the temperature and humidity microsensor and the vibration microsensor are integrated within the SIP chip and are connected respectively to the FPGA programmable logic device for sensing a temperature, humidity and vibration frequency inside the SIP chip and transmitting the information to the FPGA programmable logic device for logic calculations, so as to obtain temperature and humidity information and vibration frequency information within the SIP chip; the temperature and humidity information and the vibration frequency information are then transmitted to the background processing terminal for monitoring a working state of the SIP chip.

The present invention achieves monitoring of the internal state of the chip by incorporating the temperature and humidity sensor and the vibration sensor within the chip.

Even further, the FPGA programmable logic device, the temperature and humidity microsensor, and the vibration microsensor are integrated on an upper layer of the SIP chip; the high-speed acquisition channel and the low-speed acquisition channels are integrated on a lower layer of the SIP chip; the upper layer and the lower layer of the SIP chip are isolated by a low-temperature co-fired ceramic (LTCC) substrate to avoid mutual interference between analog signals and digital signals; devices on the upper layer of the SIP chip and devices on the lower layer of the SIP chip are connected to the LTCC substrate in a flip-chip packaging mode, so as to reduce lead inductance and enhance a heat dissipation capability of the SIP chip.

According to the present invention, the analog signal device and the digital signal device are packaged respectively on the upper layer and the lower layer of the SIP chip and are isolated using an LTCC substrate to avoid interference between analog signals and digital signals.

Even further, the SIP chip further comprises an LTCC carrier; a plurality of capacitors and resistors are surface-mounted on a surface of the LTCC carrier; connecting wires for the plurality of capacitors and resistors are arranged inside the LTCC carrier; the LTCC carrier is fixed to the LTCC substrate using adhesive; connection terminals of the plurality of capacitors and resistors are led out from an edge of the LTCC carrier, and are connected to various devices in the SIP chip through gold wire bonding, so as to reduce size and volume of the SIP chip and improve integration of the SIP chip.

Even further, the SIP chip has a dimension of 50 mm*50 mm to meet the requirement for a miniaturized transformer bushing partial discharge monitoring chip device.

In another aspect, the present invention further provides a method for monitoring transformer bushing partial discharge. The method comprises acquiring partial discharge signals and power frequency current signals from transformer bushing end screens by an acquisition unit, and transmitting the acquired partial discharge signals and power frequency current signals to an SIP digitization unit for digitization, wherein the SIP digitization unit comprises a wireless communication unit and an SIP chip;

the SIP chip comprises one high-speed acquisition channel and four low-speed acquisition channels; an input end of the high-speed acquisition channel is connected to a high frequency current sensor; the high-speed acquisition channel comprises an instrumentation amplifier and a 125 MHz high-speed A/D converter; the instrumentation amplifier is used to amplify the partial discharge signals, and the 125 MHz high-speed A/D converter is used to convert the partial discharge signals into partial discharge digital signals for subsequent logic calculations of the partial discharge digital signals; the low-speed acquisition channels comprise instrumentation amplifiers and 2 MHz low-speed A/D converters; an input end of one of the low-speed acquisition channels is connected to a power frequency current sensor; the instrumentation amplifier is used to amplify the power frequency current signals, and the 125 MHz high-speed A/D converter is used to convert the power frequency current signals into power frequency current digital signals for subsequent logic calculations of the power frequency current digital signals; input ends of the other three low-speed acquisition channels are reserved interfaces for connecting other signal acquisition devices;

the SIP digitization unit digitizes the partial discharge signals and the power frequency current signals, so as to obtain partial discharge information of the transformer, and transmits the partial discharge information to a background processing terminal through the wireless communication unit for processing, enabling the background processing terminal to determine the presence of partial discharge in the transformer bushings based on the partial discharge information.

The present invention has the following beneficial effects: The present invention can achieve simultaneous acquisition of the partial discharge signals and the power frequency current signals from the three-phase bushings of the transformer. By integrating the acquisition unit and the digitization unit, and using only short wires for connection, the transmission distance of the acquired signals is greatly reduced, and electromagnetic interference on the signals is hence reduced, thereby improving the precision of signal logic calculation and improving the accuracy of transformer bushing partial discharge monitoring.

BRIEF DESCRIPTION OF THE DRAWINGS

In order to more clearly illustrate the technical solutions in the embodiments of the present invention or in the prior art, the drawings required to be used in the description of the embodiments or the prior art are briefly introduced below. It is obvious that the drawings in the description below are some embodiments recorded in the present invention, and those of ordinary skilled in the art can obtain other drawings according to the drawings provided herein without creative efforts. In the drawings.

DETAILED DESCRIPTION OF THE EMBODIMENTS

In order to enable those skilled in the art to better understand the technical solutions in the present invention, the technical solutions in the embodiments of the present invention will be clearly and completely described below with reference to the drawings in the embodiments of the present invention, and it is obvious that the described embodiments are only a part of the embodiments of the present invention but not all of them. Based on the embodiments of the specification, all other embodiments obtained by those of ordinary skill in the art without creative effort shall fall within the protection scope of the present invention.

The embodiments of the present invention provide a transformer bushing partial discharge monitoring chip device and method. The technical solutions provided by the embodiments of the present invention are described in detail with reference to the drawings.

Figure 1:
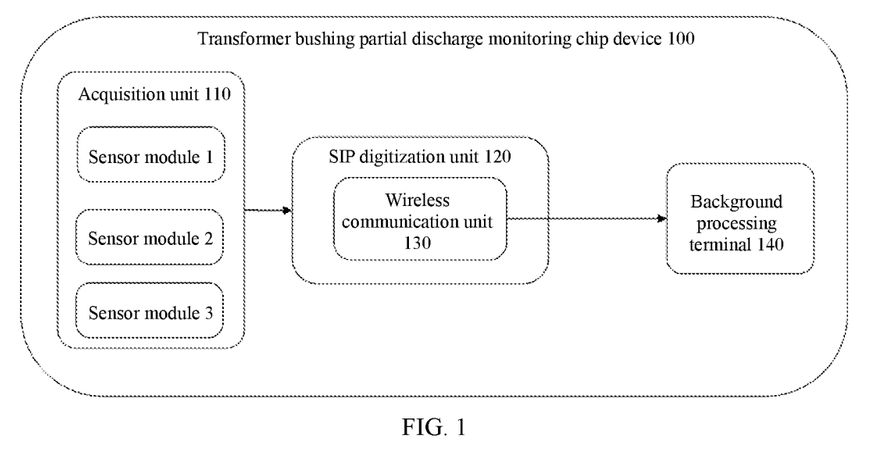
FIG. 1 is a schematic structural diagram of the transformer bushing partial discharge monitoring chip device according to the embodiments of the present invention.

Firstly, FIG. 1 is a schematic structural diagram of the transformer bushing partial discharge monitoring chip device according to the embodiments of the present invention. As shown in FIG. 1, the transformer bushing partial discharge monitoring chip device 100 comprises an acquisition unit 110, an SIP digitization unit 120, and a background processing terminal 140.

The acquisition unit 110 comprises a sensor module 1, a sensor module 2, and a sensor module 3, which are installed at the end screens of the three-phase bushings of the transformer, respectively. Each sensor module in the acquisition unit 110 is connected to the SIP digitization unit 120 through a short wire to acquire the partial discharge signals and the power frequency current signals from the transformer bushing end screens.

Specifically, the acquisition unit 110 and the SIP digitization unit 120 are designed integrally. The SIP digitization unit 120 is fixedly installed beneath the base of the acquisition unit 110. The analog signals acquired by the sensor modules can be transmitted to the SIP digitization unit 120 for on-site digitization through short wires, with minimal interference on the analog signals. The SIP digitization unit 120 is used to digitize the partial discharge signals and the power frequency current signals to obtain the partial discharge information of the transformer. The output end of the SIP digitization unit 120 is connected to the input end of the background processing terminal 140 for transmitting the partial discharge information to the background processing terminal 140 through the wireless communication unit 130 for further processing.

Figure 2:
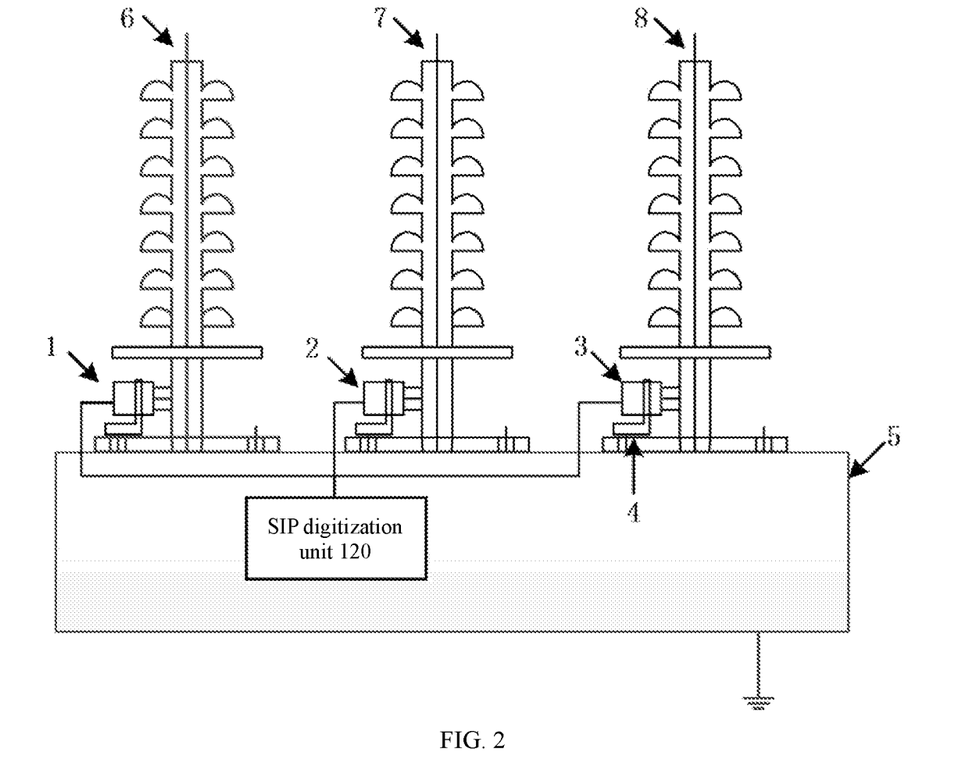
FIG. 2 is a schematic diagram of the installation position of the transformer bushing partial discharge monitoring chip device according to the embodiments of the present invention.

FIG. 2 is a schematic diagram of the installation position of the transformer bushing partial discharge monitoring chip device according to the embodiments of the present invention. As shown in FIG. 2, sensor modules 1, 2, and 3 are fixedly installed at the end screens of phase-A bushing 6, phase-B bushing 7, and phase-C bushing 8 of the transformer 5, respectively. Each sensor module is supported by a base 4 at the bottom, which bears the weight of the sensor module. This ensures uniform distribution of forces between the sensor modules and the transformer bushing end screens, avoiding damage to the transformer bushings caused by the weight of the sensor modules.

Each sensor module is connected to the SIP digitization unit 120 through a wire. The SIP digitization unit 120 is installed inside the transformer, specifically beneath the base of the sensor module. Since the sensor modules and the SIP digitization unit 120 are all installed on the transformer and in close proximity, the length of the wires connecting them is determined by the distance therebetween. Therefore, the sensor modules and the SIP digitization unit 120 may be connected with a shorter wire. This enables on-site digitization of the acquired partial discharge signals and power frequency current signals from the transformer, significantly reducing the length of wiring and minimizing electromagnetic interference received by the signals during transmission in the wire. Consequently, it improves the accuracy of subsequent signal analysis and calculations.

It should be noted that the length of the wire is determined by the distance between the sensor modules and the SIP digitization unit and is not a fixed value.

Furthermore, each sensor module consists of a high frequency current sensor and a power frequency current sensor. The high frequency current sensor is used to acquire the partial discharge signals from the transformer bushing end screens, and the power frequency current sensor is used to acquire the power frequency current signals from the transformer bushing end screens. As a result, the sensor modules according to the present invention can simultaneously acquire the partial discharge signals and the power frequency current signals from the transformer bushing end screens.

Optionally, other types of sensors, such as vibration sensors, may also be integrated into the sensor modules to expand the range of signal types acquired by the acquisition unit.

Figure 3:
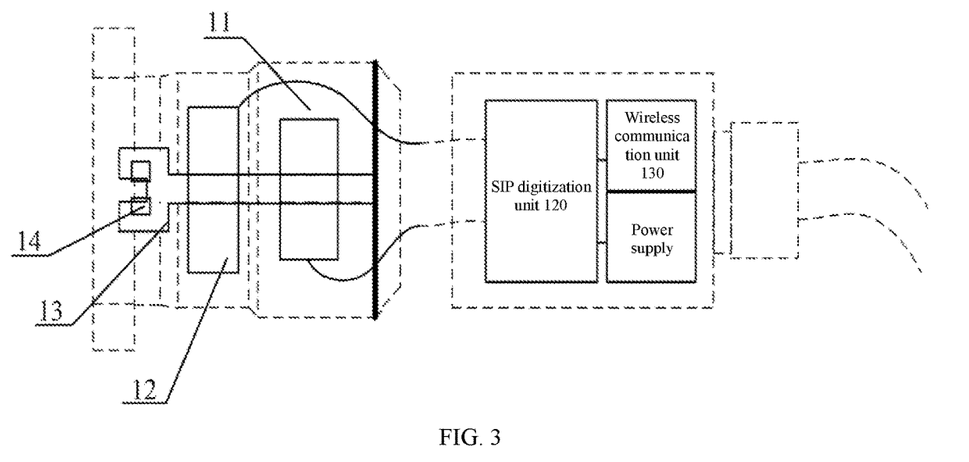
FIG. 3 is a schematic structural diagram of the acquisition unit and the SIP digitization unit according to the embodiments of the present invention.

FIG. 3 is a schematic structural diagram of the acquisition unit and the SIP digitization unit according to the embodiments of the present invention. As shown in FIG. 3, the two dashed boxes are connected with short wires. The left dashed box represents the acquisition unit 110, and the right dashed box represents the SIP digitization unit 120.

As shown in FIG. 3, the high frequency current sensor 11 and the power frequency current sensor 12 are attached to the same grounding rod 13, enabling coupled measurements. The contact fingers 14 of the two sensors are tightly crimped with the leads of the transformer bushing end screens, allowing the acquisition of the partial discharge signals and the power frequency current signals from the transformer bushing end screens through the contact fingers 14. The contact fingers 14 are connected to the grounding rod 13 which is connected to the shell of the sensor module. The shell of the sensor module is grounded, enabling reliable grounding for both sensors.

The high frequency current sensor and the power frequency current sensor are connected respectively to the SIP digitization unit 120 through short wires, so as to transmit the acquired partial discharge signals and power frequency current signals to the SIP digitization unit 120 for on-site digitization.

Specifically, the SIP digitization unit 120 comprises an SIP chip. Since the SIP digitization unit 120 according to the present invention needs to simultaneously measure the power frequency current signals and the partial discharge signals, the SIP chip needs to have high-performance acquisition and computational capabilities. Therefore, the designed SIP chip according to the present invention comprises one high-speed acquisition channel and four low-speed acquisition channels.

Specifically, the high-speed acquisition channel comprises an instrumentation amplifier and a 125 MHz high-speed A/D converter. The input end of the high-speed acquisition channel is connected to the output end of the high frequency current sensor for amplifying the partial discharge signals acquired by the high frequency current sensor and then converting them into partial discharge digital signals.

Each of the four low-speed acquisition channels comprises an instrumentation amplifier and a 2 MHz low-speed A/D converter. The input end of one of the low-speed acquisition channels is connected to the output end of the power frequency current sensor for amplifying the power frequency current signals acquired by the power frequency current sensor and then converting them into power frequency current digital signals. The input ends of the other three low-speed acquisition channels are reserved interfaces, which can be used to connect other signal acquisition devices, facilitating the future expansion of SIP chip applications.

Figure 4:
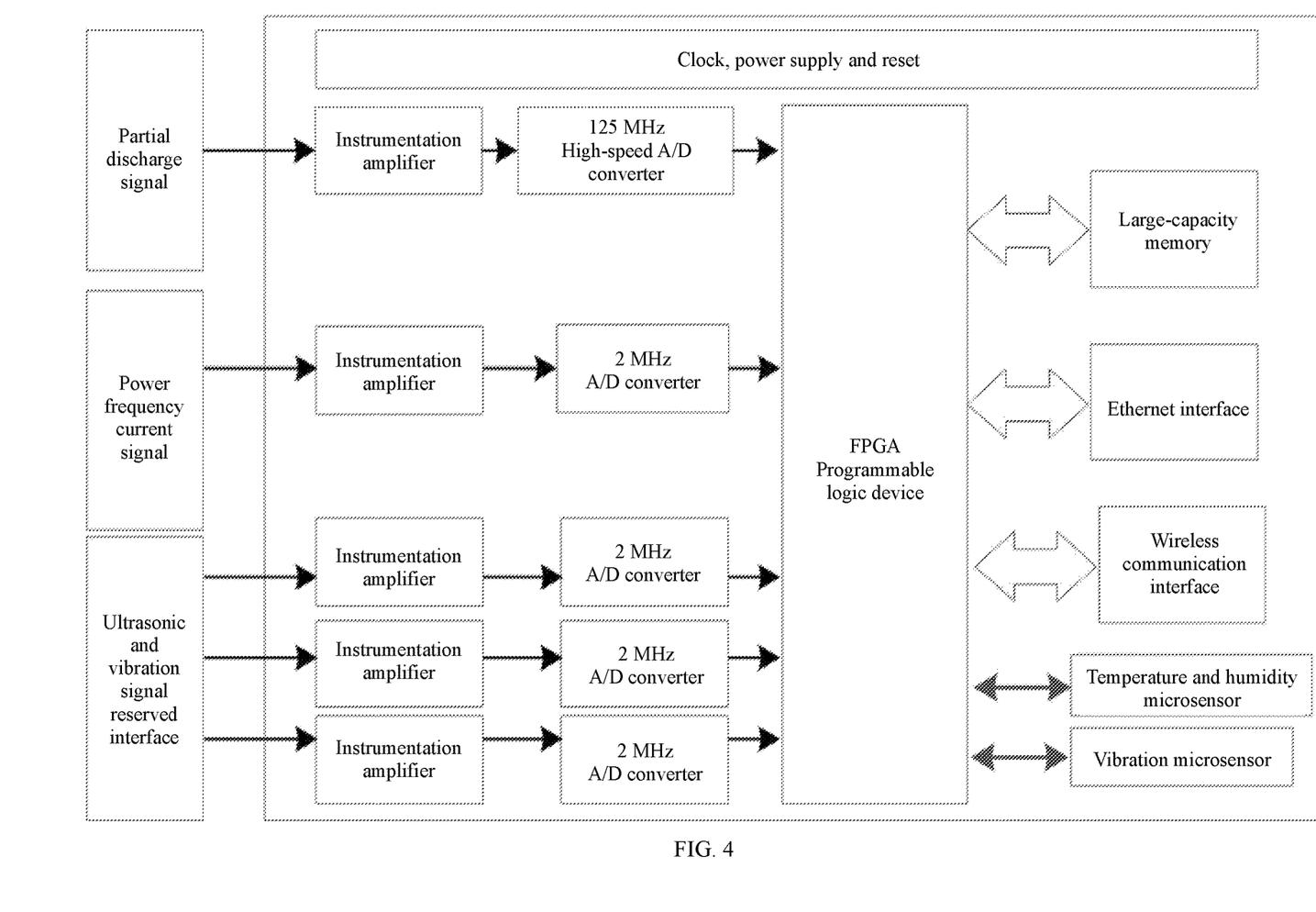
FIG. 4 is a schematic diagram of the interior circuit of the SIP chip according to the embodiments of the present invention.

In one embodiment, FIG. 4 is a schematic diagram of the interior circuit of the SIP chip according to the embodiments of the present invention. As shown in FIG. 4, the instrumentation amplifier and the 125 MHz high-speed A/D converter corresponding to the partial discharge signals form the high-speed acquisition channel; the instrumentation amplifier and the 2 MHz A/D converter corresponding to the power frequency current signals form one of the low-speed acquisition channels. The remaining three low-speed acquisition channels can be connected to ultrasonic sensors, vibration sensors, or other acquisition devices to acquire ultrasonic signals and vibration signals from the transformer bushing end screens.

The SIP chip further comprises an FPGA programmable logic device, which contains pre-configured arithmetic logic. The input ends of the FPGA programmable logic device are connected to the high-speed acquisition channel and the low-speed acquisition channels, so as to receive the partial discharge digital signals, power frequency current digital signals, and signals acquired by other acquisition devices. The received signals are then subjected to logic calculations based on the pre-configured arithmetic logic, and the calculation results are transmitted to the background processing terminal through a wireless communication interface or Ethernet interface.

The SIP chip further comprises a temperature and humidity microsensor and a vibration microsensor. The temperature and humidity microsensor and the vibration microsensor are integrated within the SIP chip and are both connected to the FPGA programmable logic device for sensing the temperature, humidity and vibration frequency inside the SIP chip and transmitting such information to the FPGA programmable logic device for logic calculations, enabling monitoring of the internal state of the chip.

Chip bonding techniques are typically divided into lead bonding and flip chip bonding methods. Lead bonding is to connect the chip and the substrate or different parts of the chip using fine wires, and flip chip bonding is to directly connect the chip's bumps to the substrate. In order to reduce lead inductance and enhance the heat dissipation capability of the chip, the present invention employs the flip-chip packaging method, where the core components of the SIP chip are directly crimp onto the substrate. This method can, on the one hand, reduce lead inductance and improve high-frequency performance, and on the other hand, enhance the heat dissipation capability of the SIP chip.

Figure 5:
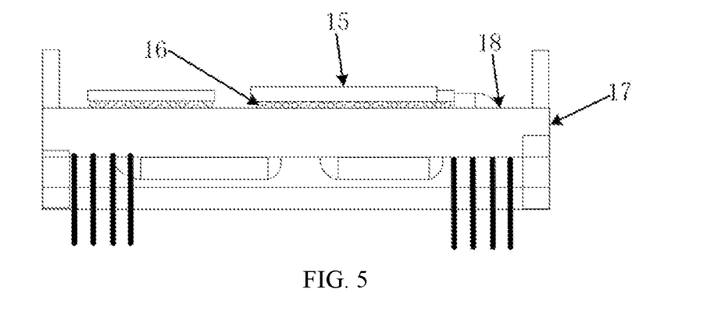
FIG. 5 is a schematic diagram of the packaging and connection of the SIP chip according to the embodiments of the present invention.

FIG. 5 is a schematic diagram of the packaging and connection of the SIP chip according to the embodiments of the present invention. As shown in FIG. 5, the present invention employs the flip-chip packaging method to directly crimp the core components of the SIP chip to the LTCC substrate 17.

Preferably, the FPGA chip 15 according to the present invention has a dimension of 18 mm*12 mm, and it features 3618 flip-chip packaging bumps 16 distributed evenly at the bottom of the device. The diameter of each bump is 90 μm, and the center-to-center spacing between the bumps is 200 sm.

To prevent interference between analog signals and digital signals, the present invention employs a digital-analog separation packaging method. Specifically, during the packaging of the SIP chip, a three-dimensional layered design is adopted where the FPGA chip, memory, and other devices are placed on the upper layer, the instrumentation amplifier (PGA) and analog-to-digital converter (ADC) are placed on the lower layer, and the upper and lower chambers are separated by burying a grounded shielding layer within the LTCC substrate, reducing interference between analog signals and digital signals.

Figure 6:
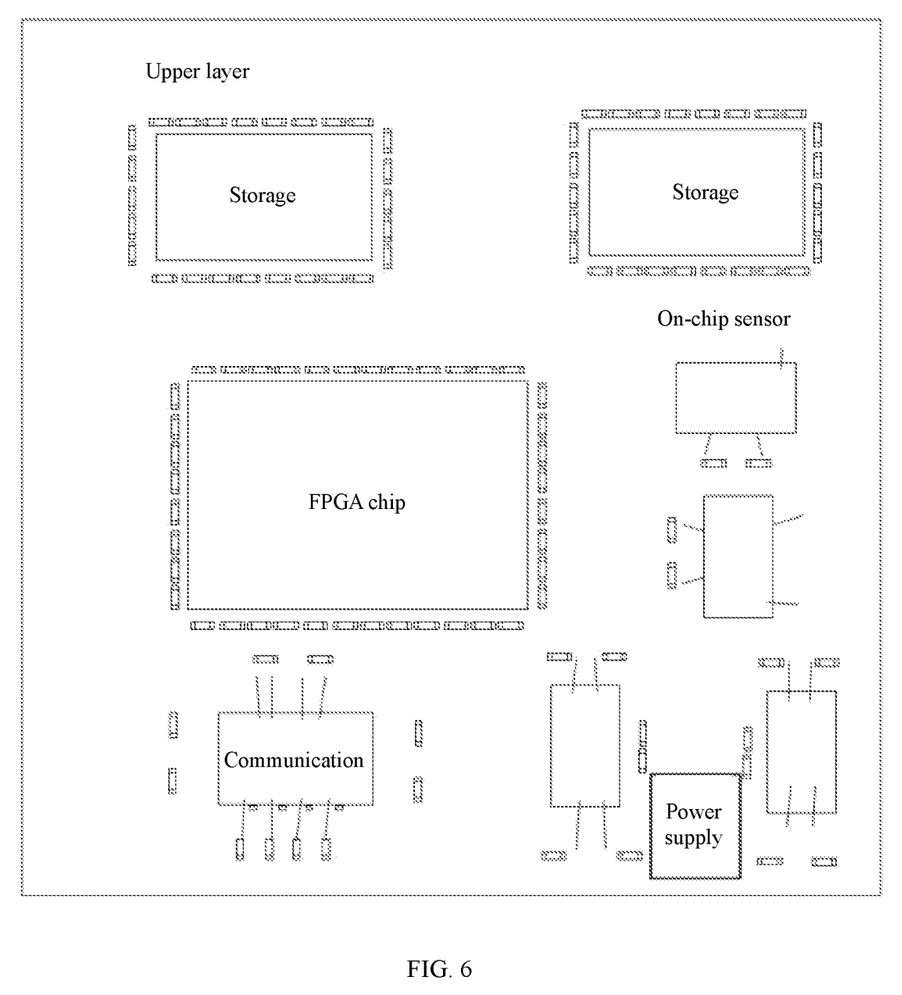
FIG. 6 is the layout diagram of the upper layer of the SIP chip according to the embodiments of the present invention.
Figure 7:
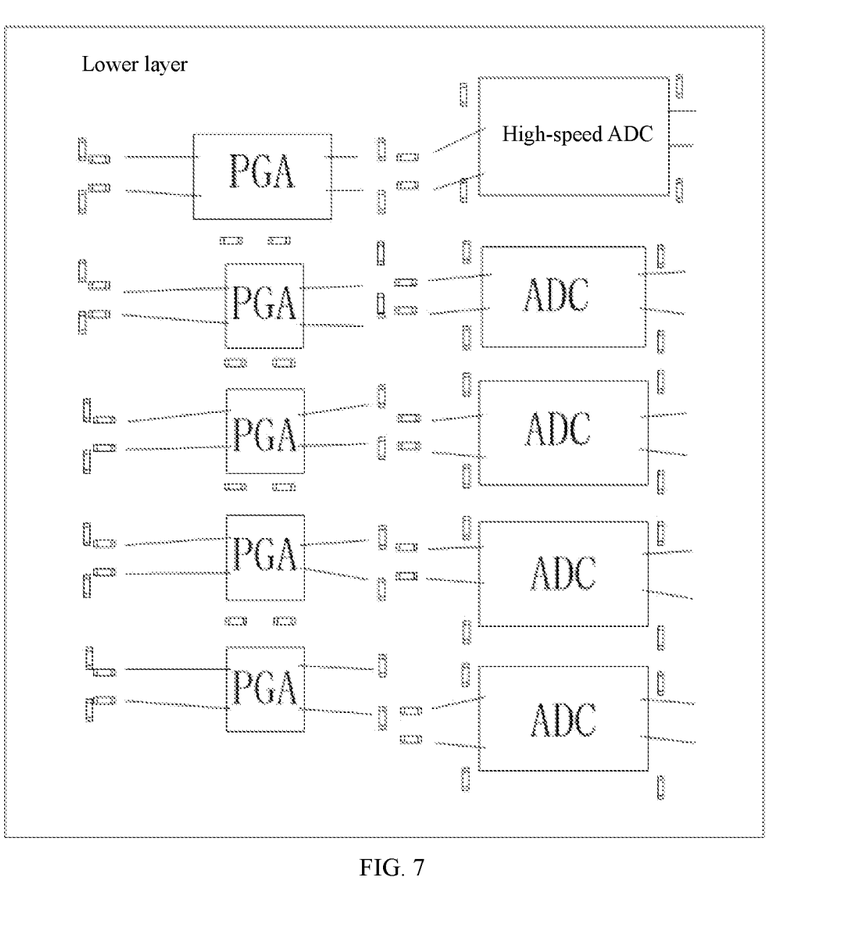
FIG. 7 is the layout diagram of the lower layer of the SIP chip according to the embodiments of the present invention.

In one embodiment, the FPGA programmable logic device, temperature and humidity microsensor, vibration microsensor, and other on-chip sensors are integrated on the upper layer of the SIP chip, and the high-speed acquisition channel and low-speed acquisition channels are integrated on the lower layer of the SIP chip. FIGS. 6 to 7 are layout diagrams of the upper layer and the lower layer of the SIP chip according to the embodiments of the present invention. As shown in FIGS. 6 to 7, five acquisition channels of the SIP chip are integrated on the lower layer, and the FPGA chip, memory, on-chip sensors, power supply, communication module, and other devices are integrated on the upper layer. The upper layer and the lower layer of the SIP chip are isolated by a low-temperature co-fired ceramic (LTCC) substrate.

The present invention uses the LTCC substrate instead of the conventional FR4 epoxy substrate, because the through-hole design and trace diameter of the LTCC substrate is significantly smaller than that of the FR4 substrate, enabling higher integration density and reduced device size. In addition, the thermal conductivity of the LTCC substrate is much higher than that of the FR-4 substrate, which enhances the chip's heat dissipation capability and improves system reliability. Lastly, the dielectric constant of the LTCC substrate is greater than that of the FR4 substrate. This allows for higher capacitance in the power-ground plane capacitor of the LTCC substrate, promoting a stable power supply and signal integrity.

Due to the inclusion of analog and digital hybrid circuits in the signal processing microsystem of the SIP chip according to the present invention, a large number of passive devices such as resistors and capacitors are required. Using pre-packaged devices would occupy a significant amount of substrate space and hinder the miniaturization of the SIP chip. One method is to use embedded resistors and capacitors in the LTCC substrate; however, the precision of the embedded resistors and capacitors can not meet the design requirements of the present invention. Therefore, the present invention provides a novel system integration solution: Capacitors and resistors are surface-mounted on the LTCC carrier, then wiring is carried out inside the LTCC carrier, where connection terminals of the resistors and capacitors are led out from the edge of the carrier, and finally the LTCC carrier is fixed to the LTCC substrate using adhesive, and the resistors and capacitors on the LTCC carrier are connected to the various devices in the SIP chip by bonding with gold bonding wire 18 (as shown in FIG. 5) to achieve electrical interconnection. The method can significantly reduce the size and volume of the device and improve the system integration.

The SIP chip designed and packaged using the above method has a dimension of 50 mm*50 mm, with a high sampling rate of 125 MHz and a bandwidth of 50 MHz. The core FPGA chip enables fast algorithm processing, providing a powerful digital processing chip for the monitoring system. The integrated design of the SIP chip and sensor modules and the multi-sensor integrated design of the sensor modules according to the present invention enables the miniaturization of the hardware for partial discharge signals and power frequency current signals acquisition and processing. This avoids electromagnetic interference caused by long signal transmission distances and improves the accuracy of transformer bushing monitoring.

The complete process of transformer bushing signal monitoring using the transformer bushing partial discharge monitoring chip device according to the present invention is as follows. Three sensor modules in the acquisition unit 110 acquire the partial discharge signals and the power frequency current signals from the end screens of the phase-A bushing, phase-B bushing, and phase-C bushing of the transformer. The signals are then transmitted to the SIP digitization unit 120 through wires. The partial discharge signals are transmitted to the high-speed acquisition channel in the SIP chip. After being amplified by the instrumentation amplifier, the signals are converted into digital signals by the high-speed A/D converter and then input into the FPGA programmable logic device for calculation. The power frequency current signals are transmitted to one of the low-speed acquisition channels in the SIP chip. After being amplified by the instrumentation amplifier, the signals are converted into digital signals by the low-speed A/D converter and also input into the FPGA programmable logic device for calculation. The FPGA programmable logic device transmits the calculation results to the background processing terminal for further processing through the Ethernet interface or wireless communication interface within the chip, thereby completing the acquisition and digitization of the signals from the transformer bushing end screen. The FPGA programmable logic device can also temporarily store the calculation results in the large-capacity memory within the chip.

In addition, the embodiments of the present invention further provide a method for monitoring transformer bushing partial discharge. The method comprises acquiring the partial discharge signals and the power frequency current signals from the transformer bushing end screens by the acquisition unit, and transmitting the acquired partial discharge signals and power frequency current signals to the SIP digitization unit for digitization. The SIP digitization unit digitizes the partial discharge signals and the power frequency current signals to obtain the partial discharge information of the transformer, and transmits the partial discharge information to the background processing terminal through the wireless communication unit for processing, enabling the background processing terminal to determine the presence of partial discharge in the transformer bushings based on the partial discharge information.

All the embodiments in the present invention are described in a progressive manner, the same and similar parts among the embodiments are referred to each other, and each embodiment focuses on the differences from other embodiments. In particular, the method embodiments, which are substantially similar to the device embodiments, are described in a relatively simple manner, and reference may be made to some descriptions of the method embodiments for relevant parts.

Specific embodiments of the present invention are described above. Other embodiments are within the scope of the appended claims. In some cases, the actions or steps recited in the claims can be performed in an order different from that in the embodiments and still achieve the desired results. In addition, the processes depicted in the drawings do not necessarily require a particular order or sequential order to achieve the desired results. Multitasking and parallel processing are also possible or may be advantageous in certain embodiments.

The above are only embodiments of the present invention and are not intended to limit the present invention. For those skilled in the art, the embodiments of the present invention can be modified and varied. Any modification, equivalent, improvement and the like made without departing from the spirit and principle of the embodiments of the present invention shall fall within the scope of the claims of the present invention.

What is claimed is:

1. A transformer bushing partial discharge monitoring chip device, comprising an acquisition unit, a system in package (SIP) digitization unit, and a background processing terminal, wherein the SIP digitization unit comprises a wireless communication unit and an SIP chip;

the acquisition unit comprises a plurality of sensor modules installed at end screens of three-phase bushings of a transformer respectively for acquiring partial discharge signals and power frequency current signals from the transformer bushing end screens;

each of the plurality of sensor modules in the acquisition unit is connected to the SIP digitization unit through a wire to transmit the partial discharge signals and the power frequency current signals to the SIP digitization unit for digitization;

the SIP digitization unit is installed inside the transformer, and a length of the wire is determined according to a distance between the acquisition unit and the SIP digitization unit;

the SIP digitization unit is fixedly installed beneath a base of the acquisition unit for digitizing the partial discharge signals and the power frequency current signals to obtain partial discharge information of the transformer bushings;

an output end of the SIP digitization unit is connected to an input end of the background processing terminal for transmitting the partial discharge information to the background processing terminal through the wireless communication unit for processing to enable the background processing terminal to determine a presence of partial discharge in the transformer bushings based on the partial discharge information, wherein each of the plurality of sensor modules comprises a high frequency current sensor and a power frequency current sensor;

the high frequency current sensor is configured to acquire the partial discharge signals from the transformer bushing end screens;

the power frequency current sensor is configured to acquire the power frequency current signals from the transformer bushing end screens;

the high frequency current sensor and the power frequency current sensor are attached to a same grounding rod;

the plurality of sensor modules are tightly crimped with leads of the transformer bushing end screens via contact fingers;

the contact fingers are connected to the grounding rod for grounding the plurality of sensor modules;

bottoms of the plurality of sensor modules are supported by bases;

the SIP digitization unit is fixedly installed beneath the bases of the plurality of sensor modules;

the high frequency current sensor and the power frequency current sensor are connected respectively to the SIP digitization unit to transmit the partial discharge signals and the power frequency current signals to the SIP digitization unit for digitization, obtaining the partial discharge information of the transformer;

the SIP chip comprises one high-speed acquisition channel and four low-speed acquisition channels;

an input end of the high-speed acquisition channel is connected to the high frequency current sensor;

the high-speed acquisition channel comprises an instrumentation amplifier and a 125 MHz high-speed analog-to-digital (A/D) converter; the instrumentation amplifier is configured to amplify the partial discharge signals, and the 125 MHz high-speed A/D converter is configured to convert the partial discharge signals into partial discharge digital signals for subsequent logic calculations of the partial discharge digital signals;

the four low-speed acquisition channels comprise instrumentation amplifiers and 2 MHZ low-speed A/D converters; an input end of one of the four low-speed acquisition channels is connected to the power frequency current sensor; the instrumentation amplifier is configured to amplify the power frequency current signals, and the 125 MHz high-speed A/D converter is configured to convert the power frequency current signals into power frequency current digital signals for subsequent logic calculations of the power frequency current digital signals;

input ends of the other three of the four low-speed acquisition channels are reserved interfaces for connecting other signal acquisition devices;

the SIP chip further comprises a field programmable gate array (FPGA) programmable logic device;

the FPGA programmable logic device comprises a pre-configured arithmetic logic;

input ends of the FPGA programmable logic device are connected to the high-speed acquisition channel and the four low-speed acquisition channels to receive the partial discharge digital signals and the power frequency current digital signals; and the partial discharge digital signals and the power frequency current digital signals are subjected to logic calculations based on the pre-configured arithmetic logic, obtaining the partial discharge information of the transformer;

the partial discharge information is transmitted to the background processing terminal through a wireless communication interface or an Ethernet interface;

the SIP chip further comprises a temperature and humidity microsensor and a vibration microsensor;

the temperature and humidity microsensor and the vibration microsensor are integrated within the SIP chip and are connected respectively to the FPGA programmable logic device for sensing a temperature, humidity and vibration frequency inside the SIP chip and transmitting the information to the FPGA programmable logic device for logic calculations to obtain temperature and humidity information and vibration frequency information within the SIP chip; the temperature and humidity information and the vibration frequency information are transmitted to the background processing terminal for monitoring a working state of the SIP chip;

the FPGA programmable logic device, the temperature and humidity microsensor, and the vibration microsensor are integrated on an upper layer of the SIP chip;

the high-speed acquisition channel and the four low-speed acquisition channels are integrated on a lower layer of the SIP chip;

the upper layer and the lower layer of the SIP chip are isolated by a low temperature co-fired ceramic (LTCC) substrate to avoid mutual interference between analog signals and digital signals; and devices on the upper layer of the SIP chip and devices on the lower layer of the SIP chip are connected to the LTCC substrate in a flip-chip packaging mode to reduce a lead inductance and enhance a heat dissipation capability of the SIP chip.

2. The transformer bushing partial discharge monitoring chip device according to claim 1, wherein the SIP chip further comprises an LTCC carrier;
   a plurality of capacitors and resistors are surface-mounted on a surface of the LTCC carrier;
   connecting wires for the plurality of capacitors and resistors are arranged inside the LTCC carrier;
   the LTCC carrier is fixed to the LTCC substrate using adhesive;
   connection terminals of the plurality of capacitors and resistors are led out from an edge of the LTCC carrier and are connected to various devices in the SIP chip through gold wire bonding to reduce a size and volume of the SIP chip and improve an integration of the SIP chip.

3. The transformer bushing partial discharge monitoring chip device according to claim 2, wherein the SIP chip has a dimension of 50 mm*50 mm to meet a requirement for a miniaturized transformer bushing partial discharge monitoring chip device.

4. A method for monitoring transformer bushing partial discharge signals utilizing the transformer bushing partial discharge monitoring chip device according to claim 1, comprising:
   acquiring the partial discharge signals and the power frequency current signals from the transformer bushing end screens by the acquisition unit, and transmitting the partial discharge signals and the power frequency current signals to the SIP digitization unit for digitization;
   wherein the SIP digitization unit digitizes the partial discharge signals and the power frequency current signals to obtain the partial discharge information of the transformer, and transmits the partial discharge information to the background processing terminal through the wireless communication unit for processing, enabling the background processing terminal to determine the presence of partial discharge in the transformer bushings based on the partial discharge information.

* * * * *

UNITED STATES PATENT AND TRADEMARK OFFICE
CERTIFICATE OF CORRECTION

| | | |
|---|---|---|
| PATENT NO. | : 12,326,471 B2 | Page 1 of 1 |
| APPLICATION NO. | : 18/283843 | |
| DATED | : June 10, 2025 | |
| INVENTOR(S) | : Xiaoxin Chen et al. | |

It is certified that error appears in the above-identified patent and that said Letters Patent is hereby corrected as shown below:

On the Title Page

Please add:
(30) Foreign Application Priority Data
Mar. 18, 2022 (CN) ......................202210268797.8

Signed and Sealed this
Twenty-second Day of July, 2025

Coke Morgan Stewart
*Acting Director of the United States Patent and Trademark Office*